United States Patent
Flynn et al.

(10) Patent No.: US 6,944,806 B2
(45) Date of Patent: Sep. 13, 2005

(54) METHOD AND APPARATUS TO DATA LOG AT-SPEED MARCH C+ MEMORY BIST

(75) Inventors: Cinda L. Flynn, Pflugerville, TX (US); Orman G. Shofner, Leander, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 447 days.

(21) Appl. No.: 10/155,897

(22) Filed: May 24, 2002

(65) Prior Publication Data

US 2003/0221146 A1 Nov. 27, 2003

(51) Int. Cl.[7] .............................................. G11C 29/00

(52) U.S. Cl. ...................................................... 714/718

(58) Field of Search ................................ 714/718, 719, 714/723, 726, 727, 733

(56) References Cited

U.S. PATENT DOCUMENTS 6,691,264 B2 * 2/2004 Huang ........................ 714/723

* cited by examiner

*Primary Examiner*—Albert Decady
*Assistant Examiner*—James C Kerveros
(74) *Attorney, Agent, or Firm*—Fulbright & Jaworski LLP

(57) ABSTRACT

A method and apparatus for data logging at-speed March C+ memory Built-in Self-tests. The method of testing a memory includes providing the memory with a Test Control and Observe wrapper; enabling a Built-in Self-test mode operation; utilizing the Test Control and Observe wrapper to capture a memory output; and holding a memory data when a failure occurs. The apparatus includes a processing unit; a Built-in Self-test controller coupled to the processing unit; a data circuit coupled to the Built-in Self-test controller; an address circuit coupled to the Built-in Self-test controller; a control circuit coupled to the Built-in Self-test controller; a memory coupled to the data circuit, the address circuit and the control circuit; a comparator circuit coupled to the memory and to the Built-in Self-test controller; and a memory Test Control and Observe wrapper coupled to the memory.

25 Claims, 2 Drawing Sheets

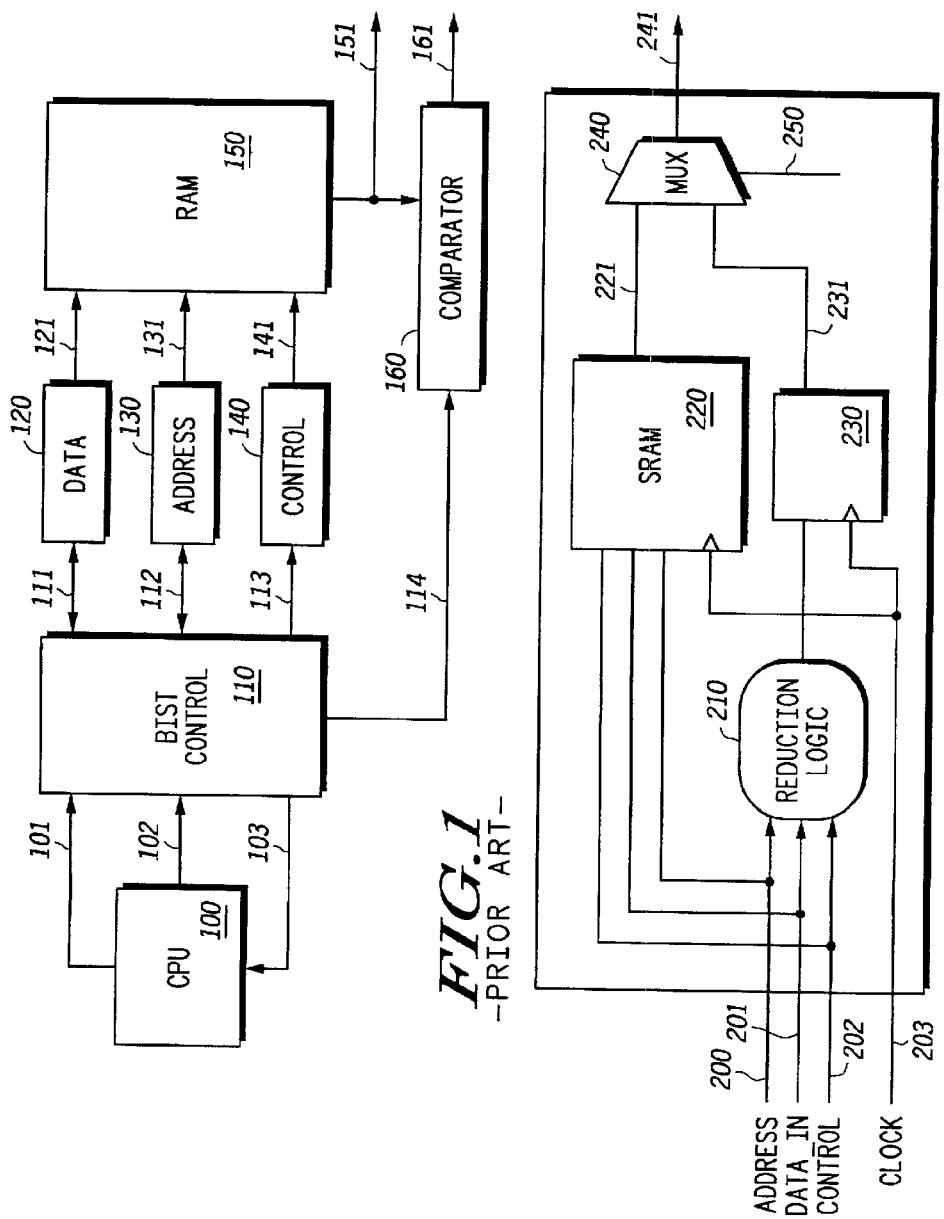
FIG.1 —PRIOR ART—
FIG.2 —PRIOR ART—

METHOD AND APPARATUS TO DATA LOG AT-SPEED MARCH C+ MEMORY BIST

BACKGROUND OF THE INVENTION

1. Field of the Invention

The invention relates generally to the field of Built-in Self-tests. More particularly, the invention relates to a Built-in Self-test for detecting faults in a memory.

2. Discussion of the Related Art

Memory Built-in Self-tests (BIST) are typically used to deliver a sequence of tests to memory modules for fault detection. Generally, a state machine can translate a test algorithm into a sequence of commands, data, and addresses to be applied to the memory modules being tested. However, under at-speed (functional) testing conditions, a state machine BIST circuit cannot operate fast enough to deliver the complex algorithms sometimes needed to intensively test the memory module. Several programmable/configurable BIST controllers have been developed to overcome these limitations.

A BIST controller can be used to screen defects in synchronous Static Random Access Memory (SRAM) devices embedded in digital designs. Running at a functional speed (at-speed), a BIST controller can implement, for example, a March C+ algorithm. March algorithms are well known in the art of Built-in Self-tests.

A problem with current BIST technology utilizing March algorithms is that in memories with automatic write through, new data written into the memory can supersede a previous read's failing data before the BIST controller can report the failing data for bitmapping. Bitmapping capability can be an important mechanism in failure analysis and yield enhancement.

An unsatisfactory approach, in an attempt to solve the above-discussed problem, involves adjusting the BIST controller to allow dead cycles between consecutive operations. Disadvantages of this approach include causing the testing algorithm to run at speeds lower than the functional speed and increasing test time. Another approach involves adding register banks to mirror the data output port of the SRAM. However, this approach causes a significant increase of the design area.

Yet another unsatisfactory approach involves implementing a control structure to allow direct observation of memory outputs during bitmapping operation. A disadvantage of this approach includes the necessity for multiple runs of the BIST controller for each memory to produce a complete bitmap, thus increasing debug and yield enhancement times.

Until now, the requirements of providing a method and/or apparatus for at-speed memory BIST data logging, which decreases design debug and yield enhancement time and minimizes design area impact have not been met.

SUMMARY OF THE INVENTION

There is a need for the following embodiments. Of course, the invention is not limited to these embodiments.

According to an aspect of the invention, a method of testing a memory comprises: providing the memory with a Test Control and Observe wrapper; enabling a Built-in Self-test mode operation; utilizing the Test Control and Observe wrapper to capture a memory output; and holding a memory data when a failure occurs. According to another aspect of the invention, an apparatus comprises: a processing unit; a Built-in Self-test controller coupled to the processing unit; a data circuit coupled to the Built-in Self-test controller; an address circuit coupled to the Built-in Self-test controller; a control circuit coupled to the Built-in Self-test controller; a memory coupled to the data circuit, the address circuit and the control circuit; a comparator circuit coupled to the memory and to the Built-in Self-test controller; and a memory Test Control and Observe wrapper coupled to the memory.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings. The invention may be better understood by reference to one or more of these drawings in combination with the description presented herein. It should be noted that the features illustrated in the drawings are not necessarily drawn to scale.

FIG. 1 is a block diagram of a prior art Built-in Self-test architecture for RAM.

FIG. 2 is a circuit diagram of a prior art scan bypass wrapper.

DESCRIPTION OF PREFERRED EMBODIMENTS

Figure 3:
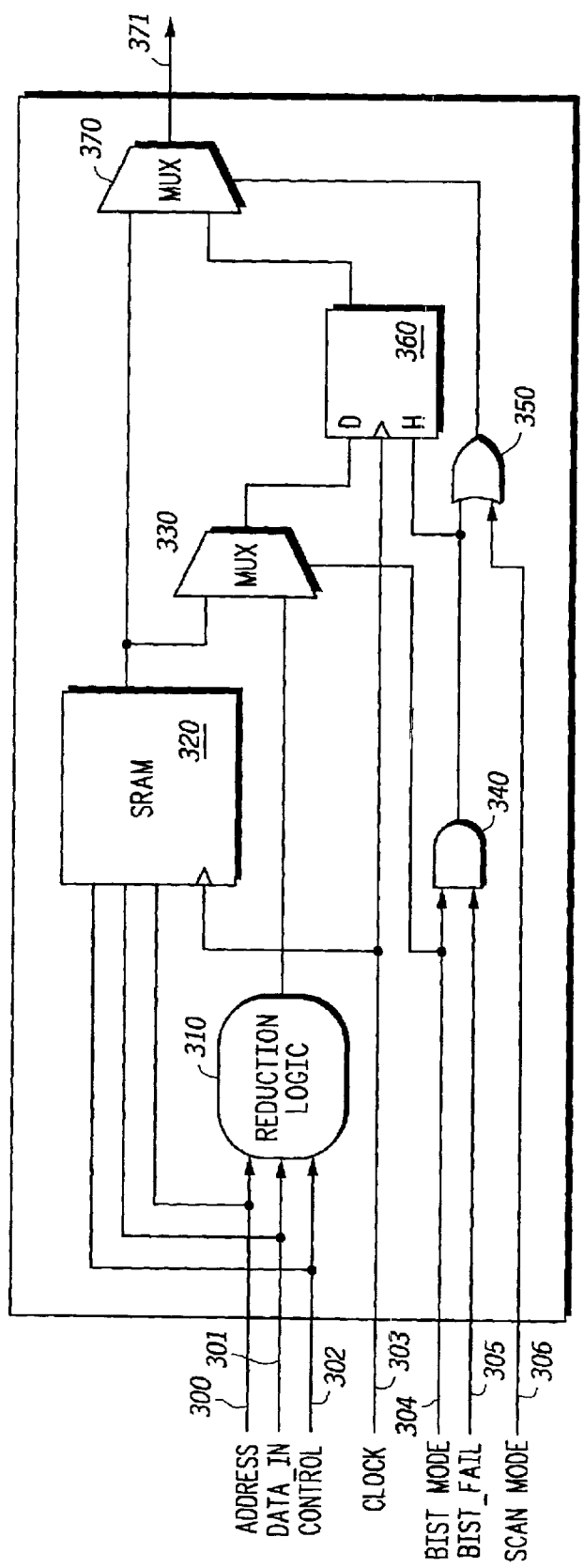
FIG. 3 is a circuit diagram of a Test Control and Observe wrapper, representing an embodiment of the invention.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those of ordinary skill in the art from this disclosure.

In general, the context of the invention can include a Built-in Self-test (BIST) method and apparatus. The context of the invention can include at-speed memory BISTs. The context of the invention can also include bitmapping a Static Random Access Memory (SRAM) with write through via an at-speed March C+ memory BIST controller.

Practical applications of the invention that have value within the technological arts include a method and apparatus to data log at-speed March C+ memory Built-in Self-tests. Further, the invention is useful in conjunction with Built-in Self-test controllers, synchronous Static Random Access Memories, or the like. There are virtually innumerable other uses for the invention, as will be understood by those of ordinary skill in the art.

A method and apparatus to data log at-speed March C+ memory Built-in Selftests, representing an embodiment of the invention, can be cost effective and advantageous for at least the following reasons. It produces correct bitmaps at-speed without added cycles and with no failure signatures masked. A single pass debug sequence may be used to yield a data stream containing only failing data, eliminating post-processing to interpret failures, decreasing design debug and yield enhancement time while maintaining test time and minimizing design area impact. The invention improves quality and/or reduces costs compared to previous approaches.

The individual components need not be combined in the disclosed configurations, but could be combined in virtually any configuration.

Although the method and apparatus to data log at-speed March C+ memory Built-in Self-tests described herein can be a separate module, it will be manifest that the method and apparatus to data log at-speed March C+ memory Built-in Self-tests may be integrated into the system with which it is (they are) associated. Furthermore, all the disclosed elements and features of each disclosed embodiment can be combined with, or substituted for, the disclosed elements and features of every other disclosed embodiment except where such elements or features are mutually exclusive.

The invention can allow flip-flops to shadow the output of a RAM unit to screen failures when in BIST mode operation. These flip-flops can also be used under scan mode operation (bypass). The invention can prevent losing data when running tests at-speed, or at functional speed. The invention is useful in conjunction with embedded write through memories on designs that use back-to-back reads and writes.

A write through policy includes writing information to both a block in the cache and to a block in a lower level memory. This policy, when compared to other memory policies, is easier to implement and allows the memory to keep the most current copy of the data.

Referring to FIG. 1, a block diagram of a prior-art Built-in Self-test architecture for a Random Access Memory (RAM) is depicted. A central processing unit (CPU) 100 is coupled to a memory BIST control unit 110 via an enabling signal 101, a function selector signal 102, and an end signal 103. The memory BIST control unit 110 is coupled to a data block 120 via a data control signal 111, and to an address block 130 via an address control signal 112. The memory BIST control unit is also coupled to a RAM control block 140 via a RAM control signal 113, and to a comparator block 160 via a comparator control signal 114. The data 120, address 130 and control 140 blocks are coupled to a RAM unit 150 via a data_in signal 121, an address signal 131 and a control signal 141, respectively. The RAM unit 150 is coupled to the comparator block 160 via a data_out signal 151. The comparator block 160 can provide a bist_fail signal 161.

Still referring to FIG. 1, the memory BIST control unit 110 communicates with the data 120, address 130, and RAM control 140 blocks upon receipt of the enabling signal 101, to assume control of the RAM unit 150 and initiate a testing procedure. The procedure can be determined by an algorithm such as a March algorithm. Following termination of the testing procedure, a data_out signal 151 from the RAM unit 150 reaches the comparator block 160, Where it is compared with the comparator control signal 114. Finally, the comparator block 161 generates the bist_fail signal 161.

While the architecture depicted in FIG. 1 can be used with several types of RAM and memory BIST controllers, at-speed March C+ memory BIST controllers produce incorrect bitmaps for synchronous SRAMs with write through. Existing solutions to this problem are not ideal because they include implementation of additional registers, which require excessive runtime during bitmapping and/or increase overall test time.

March algorithms include several operations, including writing and reading words of 0's followed by writing and reading words of 1's, in both descending and ascending address spaces, which can detect various fault types.

In one embodiment, the invention can utilize a March C+ algorithm. The types of faults which can be identified by such algorithm are: stuck-at, bridging, address decode, data decode and access time faults. A stuck-at fault can occur when the memory bit is either a logic 0 or a logic 1, regardless of the data written. A bridging fault can occur when adjacent bit cells short circuit together. Address decode or data decode faults can occur when the address or data decode logic contains defects. An access time failure can occur when any memory operation (read or write) cannot complete correctly within one functional clock cycle.

In order to detect these defects, the March C+ algorithm performs the following steps:

1. Write 0's to all memory addresses starting the lowest address (ascending);

2. Read 0 at lowest address, write 1 at lowest address, and read 1 at lowest address, repeating these operations until reaching the highest address (ascending);

3. Read 1 at lowest address, write 0 at lowest address, and read 0 at lowest address, repeating these operations until reaching the highest address (ascending);

4. Read 0 at highest address, write 1 at highest address, and read 1 at highest address, repeating these operations until reaching the lowest address (descending);

5. Read 1 at highest address, write 0 at highest address, and read 0 at highest address, repeating these operations until reaching the lowest address (descending); and 6. Reading 0's from all memory addresses starting with the highest (descending).

An implementation routine can use three cycles to perform each of the steps 2, 3, 4 and 5 mentioned above. In such implementation, the three cycles can be as follows:

a. Read (0 or 1)

b. Write (0 or 1); Compare Read Data (detect failure); and c. Read (0 or 1).

Using synchronous memories, a cycle "a" failure registers in the BIST controller on a cycle "b". However, a cycle "b" also writes new data into the memory. Therefore, in memories with automatic write through, the new data can supersede the failing data before the BIST controller can report the failing data for bitmapping. A bitmapping mode can allow the failing data, address, and BIST controller state to be presented to primary outputs for observation. Bitmap capability can be an important mechanism in failure analysis and yield enhancement. Further, as one of ordinary skill in the art will recognize, a March C+ algorithm calls for the reading and writing of a pattern and its inverse, which can include a data sequence other than the specific sequence described herein.

Design-for-test rules recommend the ability to bypass the memory when in scan mode. This is typically implemented by inserting a scan wrapper around each memory. The scan wrapper can contain a bank of flip-flops equal in width to the data out of the memory. The flip-flops provide data out during scan to provide controllability for the functional logic between the memory and the next level of registers.

The invention can provide methods and/or apparatus to allow correct bitmapping in an at-speed memory BIST controller. In one embodiment, scan bypass flip-flops are utilized in BIST mode to capture the memory data output for bitmapping. In this manner, the invention can be used for testing SRAMs with a write through policy.

Referring to FIG. 2, a circuit diagram of a prior-art scan bypass wrapper is depicted. A scan bypass wrapper circuit can be used to bypass a memory when in scan mode. An address signal 200, a data_in signal 201, and a control signal 202 are coupled to an SRAM unit 220 and to a reduction logic block 210. The SRAM 220 is coupled to a first input of a multiplexer 240 via an sram_data_out signal 221. The reduction logic block 210 is coupled to a flip-flop 230. The flip-flop 230 is coupled to a second input of the multiplexer 240 via a bypass_data signal 231. A scan signal 250 is coupled to the addressing input of the multiplexer 240. The multiplexer 240 can provide a data_out signal 241. A clock signal 203 is coupled to the SRAM unit 220 and to the flip-flop 230. The flip-flop 230 can be a bank of flip-flops.

In one embodiment, the invention provides a method and/or apparatus for utilizing flip-flops in BIST mode to capture the memory data out and hold the data when a failure occurs to allow correct information to be provided and therefore creating accurate bitmapping.

Referring to FIG. 3, a circuit diagram of a Test Control and Observe (TCO) wrapper in accordance with embodiments of the present disclosure is depicted. The TCO wrapper can be a scan bypass wrapper modified and operable for use as a memory BIST observation wrapper. Inputs to the TCO wrapper can include scan bypass signals (see FIG. 2) and BIST control signals (from a BIST controller, see FIG. 1). In operation, the TCO wrapper can be in a BIST state or in a scan bypass state. When in a scan bypass state, the TCO wrapper complies with design-for-test recommendations. In BIST mode, the TCO wrapper can control and observe a memory Built-in Self-test process.

Still referring to FIG. 3, a set of input signals (i.e. an address signal 300, a data_in signal 301 and a control signal 302) is coupled to an SRAM unit 320 and to a logic reduction block 310. The SRAM is coupled to a first data input of a first multiplexer 330 and to a first data input of a second multiplexer 370. The reduction logic block 310 is coupled to a second input of the first multiplexer 330.

Still referring to FIG. 3, a BIST mode signal 304 and a BIST_fail signal 305 are coupled to an AND gate 340. The BIST mode signal 304 is also coupled to an addressing input of the first multiplexer 330. The AND gate 340 and a scan mode signal 306 are coupled to an OR gate 350. The AND gate is also coupled to an H input of a flip-flop 360. The first multiplexer is coupled to a D input of the flip flop 360. The flip-flop 360 is coupled to a second input of the second multiplexer 370. The OR gate 350 is coupled to an addressing input of the second multiplexer 370. The second multiplexer 370 can provide a data_out signal 371. The flip-flop 360 can be a bank of flip-flops and is a scalable feature of the invention.

Still referring to FIG. 3, the flip-flop 360 includes a hold input commonly used in the art. The hold input can be designed, for example, by introducing a multiplexer wherein a first input to the multiplexer is coupled to the output of the flip-flop, and a second input to the multiplexer is the actual data to be held. The addressing input of the multiplexer can be a hold signal, which switches the multiplexer to the first input, effectively holding the data in the circuit. However, it is to be clearly understood that this design is made only by way of example.

Still referring to FIG. 3, the first multiplexer 330 is added before of the D input of the flip flop 360. The BIST mode signal 304 selects between the output of the SRAM unit 320 and the output of the reduction logic block 310 (scan mode inputs). A hold signal is added to the flip-flop 360 controlled by a BIST failure indication (output of the AND gate 340) to keep the current value until bitmapping is complete. Finally, the second multiplexer 370 selects between the flip-flop 360 data and the SRAM unit data output according to the output of the OR gate 350 so that change in the second multiplexer 370 selector depends on the bist_mode signal 304, the BIST_fail signal 305, and the scan mode signal 306.

Still referring to FIG. 3, the first multiplexer 330 selects between a memory data and a bypass data according to a Built-in Self-test mode signal (BIST mode signal 304). The output of the first multiplexer 330 is coupled with the input of the flip-flop 360 and a first logic gate (AND gate 340) is used to determine a hold condition for the flip-flop. The second multiplexer 370 is used to select between the memory data and a flip-flop data according to a mode of operation, which is determined by a second logic gate (OR gate 350).

Modes of operation can include a BIST mode, a scan mode and a normal mode (neither BIST nor scan). Each mode of operation can be determined by the use of logic gates as described above. In case the mode of operation is BIST or scan, the second multiplexer 370 selects the output of the flip-flop 360 as its input. Otherwise the second multiplexer 370 selects the output of the SRAM unit 320 as its input. Thus, the mode of operation can determine the output of the TCO wrapper.

The illustrated hardware can allow correct bitmapping in an at-speed memory BIST controller. A bank of scan bypass flip-flops in BIST mode can capture the data output for bitmapping. The data is held when a failure occurs, allowing correct data to be provided during bitmapping. While this solution adds minimal hardware to design, it produces correct memory bitmaps in minimal time. Also, there are no technology or process dependencies. The invention can be used for any type of static memories.

The invention can include Built-in Self-tests. More particularly, the invention can include a Built-in Self-test for detecting faults in a memory. The invention can also include an at-speed memory Built-in Self-test method and apparatus for detecting faults in a synchronous static random access memory.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computing system.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method of testing a memory, comprising:
   providing the memory with a Test Control and Observe wrapper, comprising:
     a random access memory;
     first and second multiplexers coupled to an output of the random access memory;
     a flip-flop coupled to an output of the first multiplexer and to an input of the second multiplexer;
     first and second logic gates coupled to an input of the flip-flop;
   enabling a Built-in Self-test mode operation of the Test Control and Observe wrapper using the first logic gate;
   utilizing the Test Control and Observe wrapper to test memory data by selecting a memory data via the first multiplexer; and
   holding the memory data when a failure occurs using the second multiplexer, flip-flop and second logic gate.

2. The method of claim 1, the random access memory comprising a static random access memory.

3. The method of claim 2, the static random access memory comprising a static random access memory with a write through policy.

4. The method of claim 1, further comprising utilizing the Test Control and Observe wrapper at functional speed.

5. The method of claim 1, the step of holding the memory further comprising utilizing the memory data for memory bitmapping.

6. The method of claim 1, further comprising utilizing the Test Control and Observe wrapper to bypass the memory during a scan mode operation.

7. The method of claim 1, wherein enabling the Built-in Self-test mode operation includes executing a test algorithm.

8. The method of claim 7, wherein enabling the Built-in Self-test mode operation includes executing a March algorithm.

9. The method of claim 8, wherein enabling the Built-in Self-test mode operation includes executing a March C+ algorithm.

10. A method comprising:
    providing a scan bypass wrapper comprising:
      a reduction logic;
      a random access memory coupled to the reduction logic;
      first and second multiplexers coupled to an output of the random access memory;
      a flip-flop coupled to an output of the first multiplexer and to an input of the second multiplexer;
      first and second logic gates coupled to an input of the flip-flop;
    utilizing the first multiplexer to select between a memory data of the random access memory and a bypass data of the reduction logic according to a Built-in Self-test mode signal;
    utilizing the second logic gate to determine the mode of operation;
    utilizing the second multiplexer to select between the memory data and a flip-flop data according to a mode of operation; and
    utilizing the first logic gate to determine a hold condition for the flip-flop when a failure occurs.

11. The method of claim 10, the first logic gate comprising an AND logic gate.

12. The method of claim 10, the second logic gate comprising an OR logic gate.

13. An apparatus, comprising:
    a processing unit;
    a Built-in Self-test controller coupled to the processing unit;
    a data circuit coupled to the Built-in Self-test controller;
    an address circuit coupled to the Built-in Self-test controller;
    a control circuit coupled to the Built-in Self-test controller;
    a memory coupled to the data circuit, the address circuit and the control circuit;
    a comparator circuit coupled to the memory and to the Built-in Self-test controller; and
    a memory Test Control and Observe wrapper coupled to the memory comprising:
      first and second multiplexers coupled to an output of the memory;
      a flip-flop coupled to an output of the first multiplexer and to an input of the second multiplexer; and
      first and second logic gates coupled to an input of the flip-flop.

14. The apparatus of claim 13, wherein the memory includes a random access memory.

15. The apparatus of claim 14, wherein the random access memory includes a static random access memory.

16. The apparatus of claim 15, wherein the static random access memory includes a synchronous static random access memory.

17. The apparatus of claim 16, wherein the synchronous static random access memory includes a synchronous static random access memory with a write-through policy.

18. The apparatus of claim 13, wherein the memory Test Control and Observe wrapper is operable to perform a Built-in Self-test operation.

19. The apparatus of claim 13, wherein the memory Test Control and Observe wrapper is operable to perform a memory bypass scan operation.

20. A memory Test Control and Observe wrapper, including:
    a set of input signals;
    a memory coupled to the set of input signals;
    a reduction circuit coupled to the set of input signals;
    a first multiplexer coupled to the reduction circuit, the memory, and a Built-in Self-test mode signal;
    a first logic gate coupled to the Built-in Self-test mode signal and to a Built-in Self-test fail signal;

a flip-flop coupled to the first multiplexer and to the first logic gate;

a second multiplexer coupled to the memory and to the flip-flop;

a second logic gate coupled to the first logic gate, a scan mode signal and the second multiplexer;

a clock signal coupled to the memory and to the flip-flop; and a data out signal coupled to the second multiplexer.

21. The apparatus of claim 20 wherein the memory is a random access memory.

22. The apparatus of claim 20, wherein the first logic gate includes one or more logic gates for implementing an AND logic function, the one or more logic gates comprising a first input coupled to the Built-in Self-test mode signal and a second input coupled to a Built-in Self-test fail signal.

23. The apparatus of claim 20, wherein the second logic gate includes one or more logic gates for implementing an OR logic function, the one or more logic gates comprising a first input coupled to the output of the first logic gate and a second input coupled to a scan mode signal.

24. The apparatus of claim 20 wherein the flip-flop includes a bank of flip-flops.

25. The apparatus of claim 24 wherein the bank of flip-flops is equal in width to a data output of the memory.

* * * * *